(12) United States Patent
Komuro

(10) Patent No.: US 8,089,161 B2
(45) Date of Patent: Jan. 3, 2012

(54) SEMICONDUCTOR DEVICE AND METHOD OF MANUFACTURING THE SAME

(75) Inventor: Masahiro Komuro, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 79 days.

(21) Appl. No.: 12/385,840

(22) Filed: Apr. 21, 2009

(65) Prior Publication Data

US 2009/0278230 A1 Nov. 12, 2009

(30) Foreign Application Priority Data

May 12, 2008 (JP) .................................. 2008-125042

(51) Int. Cl.
*H01L 21/00* (2006.01)
(52) U.S. Cl. ........ 257/774; 257/642; 257/648; 257/784; 257/532
(58) Field of Classification Search ................... 257/774, 257/642, 648, 784
See application file for complete search history.

(56) References Cited

U.S. PATENT DOCUMENTS

2002/0027293 A1 3/2002 Hoshino
2006/0057834 A1* 3/2006 Akagawa et al. ............. 438/612

FOREIGN PATENT DOCUMENTS

JP 2001-339057 12/2001
JP 2006-041450 2/2006

OTHER PUBLICATIONS

Chinese Office Action dated Jun. 11, 2010, with English translation.

* cited by examiner

*Primary Examiner* — Long Pham
(74) *Attorney, Agent, or Firm* — McGinn Intellectual Propery Law Group, PLLC

(57) ABSTRACT

A semiconductor device has a substrate, an insulating interlayer, an interconnect as one example of an electro-conductive pattern, a through-electrode, and a bump as one example of a connection terminal, wherein the insulating interlayer is positioned up above the surface of the substrate, the interconnect is positioned on the surface of the insulating interlayer, the through-electrode extends through the substrate and the insulating interlayer, from the back surface of the former to the surface of the latter, one end of which is connected to the interconnect, and the bump is provided on the back surface side of the substrate, and connected to the other end of the through-electrode.

10 Claims, 7 Drawing Sheets

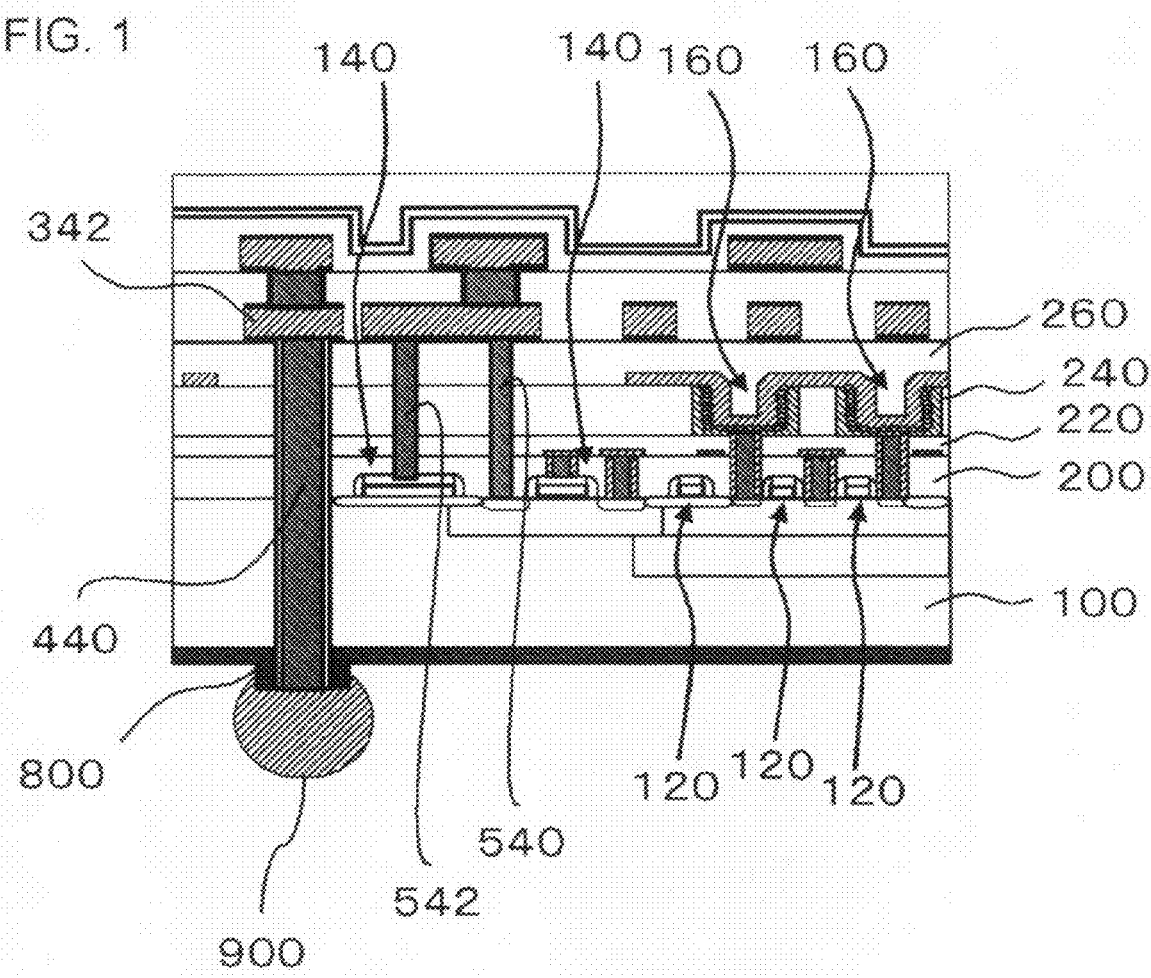

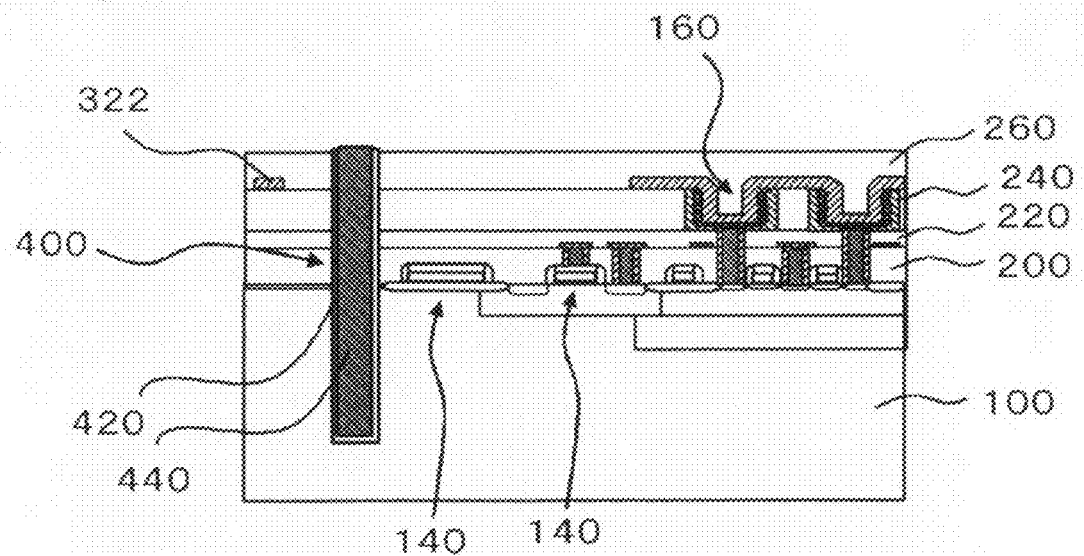
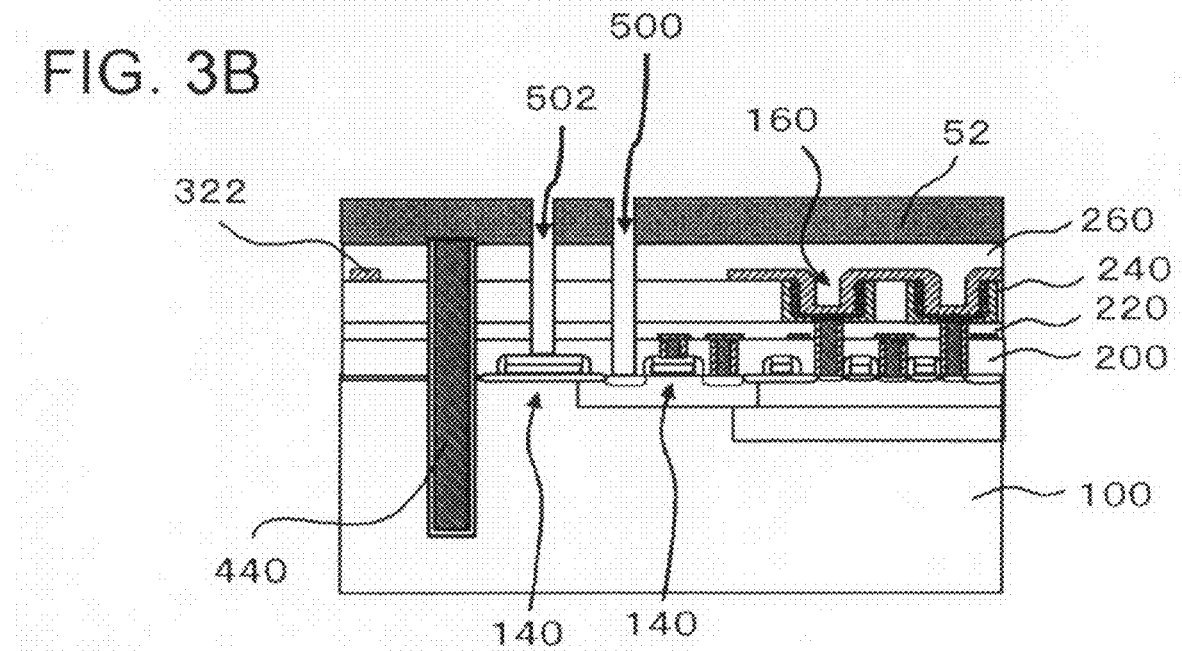

SEMICONDUCTOR DEVICE AND METHOD OF MANUFACTURING THE SAME

This application is based on Japanese patent application No. 2008-125042 the content of which is incorporated hereinto by reference.

BACKGROUND

1. Technical Field

The present invention relates to a semiconductor device having a through-electrode, and a method of manufacturing the same.

2. Related Art

In recent years, there has been developed a technique of three-dimensionally integrating semiconductor devices, by bonding semiconductor devices having semiconductor elements formed therein. By this technique, a through-electrode is provided to a semiconductor substrate of the semiconductor device. The semiconductor element formed on the surface of the semiconductor substrate is connected to other semiconductor device, through the interconnect formed over the insulating interlayer and through-electrode (see Japanese Laid-Open Patent Publication Nos. 2001-339057 and 2006-41450, for example).

In the semiconductor devices described in these patent documents, one end of through-electrode on the top surface side of the substrate is positioned on the surface of the substrate or on the surface of a device isolation film. For the purpose of connecting any electro-conductive pattern positioned on an insulating interlayer with the through-electrode, it may therefore be necessary to form a viaplug (connection plug), allowing therethrough connection of the electro-conductive pattern and the through-electrode, in the insulating interlayer. However, the diameter of the viaplug formed in the lowermost insulating interlayer has extremely been shrunk, in an ongoing tendency of shrinkage of semiconductor devices. For this reason, contact failure between the through-electrode and the electro-conductive pattern has been becoming more likely to occur, when the through-electrode and the viaplug are misaligned with each other.

SUMMARY

According to the present invention, there is provided a semiconductor device which includes:

a substrate;

a first insulating interlayer formed over one surface of the substrate;

an electro-conductive pattern formed over the first insulating interlayer;

a connection terminal provided over the other surface of the substrate; and a through-electrode extended through the substrate and the first insulating interlayer, so as to connect the electro-conductive pattern and the connection terminal.

Since the through-electrode is provided through the substrate and the first insulating interlayer, and is directly connected to the electro-conductive pattern on the first insulating interlayer, so that it is no more necessary to provide any connection plug used for connecting the through-electrode with the electro-conductive pattern. Allowance for the misalignment may therefore increase, as compared with the case where the through-electrode and the electro-conductive pattern are connected via the connection plug. As a consequence, connection failure between the through-electrode and the electro-conductive pattern may be suppressed.

According to the present invention, there is provided also a method of manufacturing a semiconductor device which includes:

forming a first insulating interlayer positioned above one surface of a substrate;

forming a first hole extended from the surface of said first insulating interlayer to midway of said substrate;

forming a through-electrode in said first hole;

forming an electro-conductive pattern positioned on the surface of said first insulating interlayer, and connected to one end of said through-electrode;

making the other end of said through-electrode expose, by removing the other surface of said substrate; and forming a connection terminal connected to the other end of said through-electrode, on the other surface of said substrate.

The through-electrode may directly be connected to elements (transistors which are disposed below the insulating interlayer) in some cases, and may indirectly be connected via any other interconnect or connection plug in some cases. In both cases, the through-electrode is electrically connected with the element.

According to the present invention, any connection failure between the through-electrode and the electro-conductive pattern may be suppressed.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1 is a sectional view illustrating a configuration of a semiconductor device according to an embodiment, and FIGS. 2A to 7B are sectional views sequentially illustrating the individual steps of manufacturing the semiconductor device illustrated in FIG. 1.

DETAILED DESCRIPTION

Figure 2A:
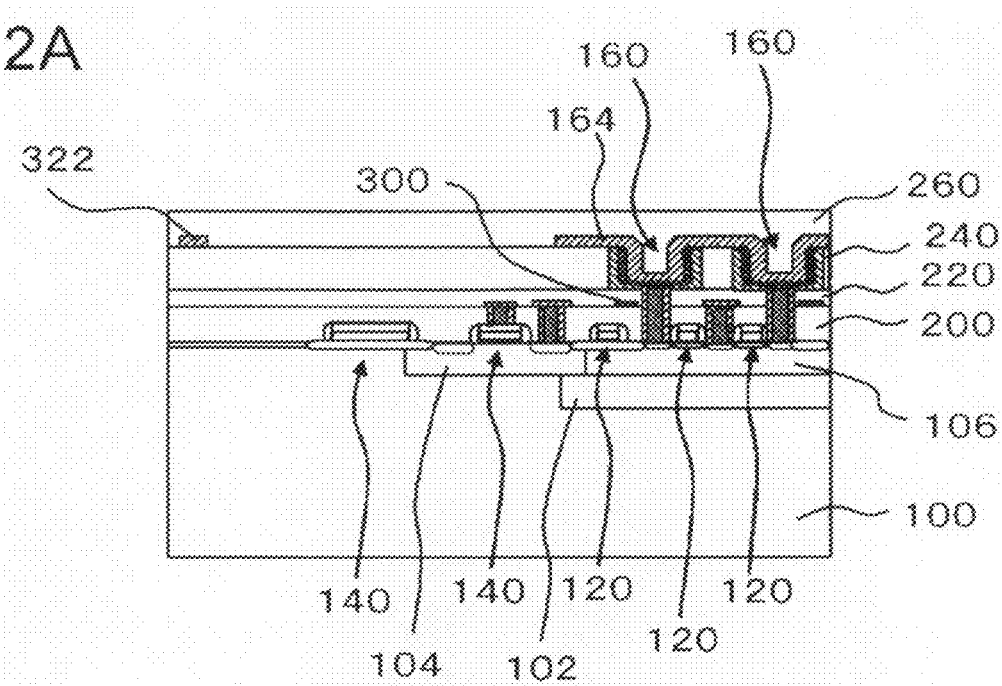

The invention will now be described herein with reference to an illustrative embodiment. Those skilled in the art will recognize that many alternative embodiments can be accomplished using the teachings of the present invention and that the invention is not limited to the embodiment illustrated for explanatory purposes.

Embodiments of the present invention will be explained below, referring to the attached drawings. Note that, in all drawings, any similar constituents may be given with similar reference numerals or symbols, and explanations therefor will not be repeated.

FIG. 1 is a sectional view illustrating a configuration of a semiconductor device of this embodiment. The semiconductor device has a substrate 100, an insulating interlayer 260, an interconnect 342 as one example of the electro-conductive pattern, a through-electrode 440, and a bump 900 as one example of the connection terminal. The insulating interlayer 260 is positioned on one surface (top surface) of the substrate 100. The interconnect 342 is formed over the insulating interlayer 260. The bump 900 is provided on the opposite surface (back surface) of the substrate 100. The through-electrode 440 extends through the substrate 100 and the insulating interlayer 260, so as to connect the interconnect 342 with the bump 900.

In the semiconductor device, one end of the through-electrode 440 is directly connected to the interconnect 342. Accordingly, the connection failure between the through-electrode 440 and the interconnect 342 may be suppressed, even if the relative position between the through-electrode 440 and the interconnect 342 should be misaligned in the direction of extension of the interconnect 342. The connection failure between the through-electrode 440 and the electro-conductive pattern may be suppressed also when the electro-conductive pattern is provided in place of the interconnect 342, because the area of the electro-conductive pattern may be set larger than the area of the via or contact. The effect will be detailed below.

The interconnect 342 or the electro-conductive pattern may be composed of, for example, an Al pattern formed on the insulating interlayer 260, or may be a Cu pattern buried in the surficial portion of the insulating interlayer 260 by the damascene process. In the explanation below, any interconnects positioned on the surface of the insulating interlayers may be Al patterns formed on the insulating interlayer, or may be Cu patterns buried into the insulating interlayers by the damascene process.

In the example illustrated in this drawing, the insulating interlayer 260 is a third insulating interlayer. Between the substrate 100 and the insulating interlayer 260, a first insulating interlayer 200, and second insulating interlayers 220, 240 are disposed. The through-electrode 440 is directly connected to the interconnect 342, after being extended through the substrate 100 and the insulating interlayers 200, 220, 240, 260.

Below the insulating interlayer 260, there are disposed elements such as transistors 120, 140 and capacitor elements 160. The transistors 120 and the capacitor elements 160 compose a DRAM. The capacitor elements 160 are disposed over the second insulating interlayers 220, 240. The capacitor elements 160 are typically those having cylinder-type electrodes. For the case where the lower electrode is made of polysilicon, the surface of the lower electrode may be treated to have HSG (hemispherical grains). The transistors 140 compose a logic circuit or a peripheral circuit of the DRAM.

At least one of these elements (the transistors 140 in the example illustrated in the drawing) is electrically connected to connection plugs 540, 542 which extend through the insulating interlayer 260. In the example illustrated in this drawing, the connection plugs 540, 542 are extended through the insulating interlayers 200, 220, 240, 260, and are directly connected to the transistors 140.

In the example illustrated in this drawing, the diameter of the through-electrode 440 is larger than that of the connection plugs 540, 542. The diameter of the through-electrode 440 is preferably five times or more as large as the connection plugs 540, 542. The diameter of the through-electrode 440 is typically 5 μm or larger and 20 μm or smaller.

The other end of the through-electrode 440 is projected out from the back surface of the substrate 100. The portion of the other end of the through-electrode 440, projected out from the back surface of the substrate 100, has an insulating film 800 formed on the side face thereof. The insulating film 800 is formed also around the circumference of the through-electrode 440 on the back surface of the substrate 100.

The through-electrode 440 may be shrunk in the diameter in a portion more closer to the back surface of the substrate 100.

The individual drawings from FIG. 2A to FIG. 7B are sectional views explaining a method of manufacturing the semiconductor device illustrated in FIG. 1. First, as illustrated in FIG. 2A, a first-conductivity-type (N-type, for example) deep well 102, a first-conductivity-type well 104, a second-conductivity-type (P-type, for example) well 106, a device isolation film, and the transistors 120, 140 are formed in, or over the substrate 100. Next, the insulating interlayer 200, an interconnect 300 positioned on the insulating interlayer 200, the insulating interlayers 220, 240, the capacitor elements 160, and an alignment mark 322 are formed. The alignment mark 322 is positioned on the surface of the insulating interlayer 240, and formed typically in the same process with an interconnect (not illustrated) positioned on the surface of the insulating interlayer 240 and an upper electrode 164 of the capacitor elements 160. Next, the insulating interlayer 260 is formed over the insulating interlayer 240, the capacitor elements 160, and the alignment mark 322.

Figure 2B:
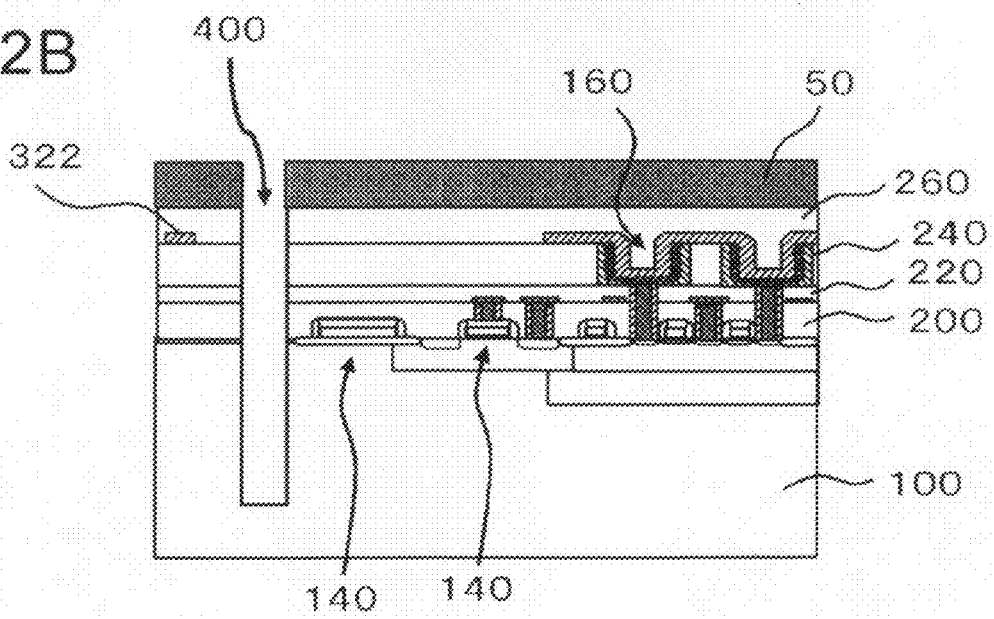

Next, as illustrated in FIG. 2B, a resist pattern 50 is formed over the insulating interlayer 260. The resist pattern 50 has an opening pattern over the region where the through-electrode 440 will be provided therein later. When the opening pattern of the resist pattern 50 is formed, alignment is carried out on the basis of the alignment mark 322.

Next, the insulating interlayers 260, 240, 220, 200, the device isolation film, and the substrate 100 are etched, using the resist pattern 50 as a mask. A first hole 400 is thus formed in the insulating interlayer 260, 240, 220, 200, the device isolation film, and the substrate 100. The distance from the surface of the substrate to the bottom of the first hole 400 is typically 20 μm or larger and 100 μm or smaller. The first hole 400 is a hole to be filled with the through-electrode 440, and extends from the surface of the insulating interlayer 260 to a midway of the substrate 100. Since a plurality of insulating interlayers are preliminarily formed when the first hole 400 is formed, so that charge-induced damage possibly applied to the transistors 120, 140 in the process of formation of the first hole 400 may be reduced. The region where the first hole 400 is formed may have no device isolation film formed therein.

Thereafter, as illustrated in FIG. 3A, the resist pattern 50 is removed. Next, on the side faces and the bottom of the first hole 400, an inner wall insulating film 420 is formed. In this process, the inner wall insulating film 420 is formed also over the insulating interlayer 260 (not illustrated). The inner wall insulating film 420 is typically a silicon oxide film, or a stacked film of a silicon oxide film and a silicon nitride film, and is formed by CVD. The thickness of the inner wall insulating film 420 is typically 0.1 μm or larger and 1 μm or smaller.

Next, a barrier film (not illustrated) is formed over the inner wall insulating film 420. The barrier film is a film for preventing diffusion of metal, and is typically a single-layered film selected from the group consisting of Mo film, TiN film, TaN film, TiW film, Ti film, Ta film, and Cr film, or a stacked film obtained by stacking a plurality of films selected from the group.

Next, the through-electrode 440 is filled into the first hole 400. The through-electrode 440 may be formed typically by repeating a step of forming an electro-conductive film and a step of planarizing it a plurality of times. The step of forming the electro-conductive film is typically a step of forming a tungsten film by CVD, wherein typically 1 μm or thinner film may be formed by a single cycle of film formation. The step of planarization is typically a step of carrying out an etchback process and CMP (Chemical Mechanical Polishing) in this order. A step of forming a film similar to the above-described barrier film may be provided between the CMP process and the step of forming the electro-conductive film in the next cycle. In some process, the inner wall insulating film 420 may be remained on the insulating interlayer 260.

Next, as illustrated in FIG. 3B, a resist pattern 52 is formed over the insulating interlayer 260 and the through-electrode 440. The resist pattern 52 has opening patterns over the regions where the connection plugs 540, 542 are provided therein later. When the opening patterns of the resist pattern 52 are formed, alignment is carried on the basis of the alignment mark 322.

Next, the insulating interlayers 260, 240, 220, 200 are etched using the resist pattern 52 as a mask. Second holes 500, 502 are thus formed in the insulating interlayers 260, 240, 220, 200. The second holes 500, 502 are holes to be filled with the connection plugs 540, 542, wherein the former is positioned on the source or drain region, and the latter is positioned on the gate electrode of the transistors 140.

Figure 4A:
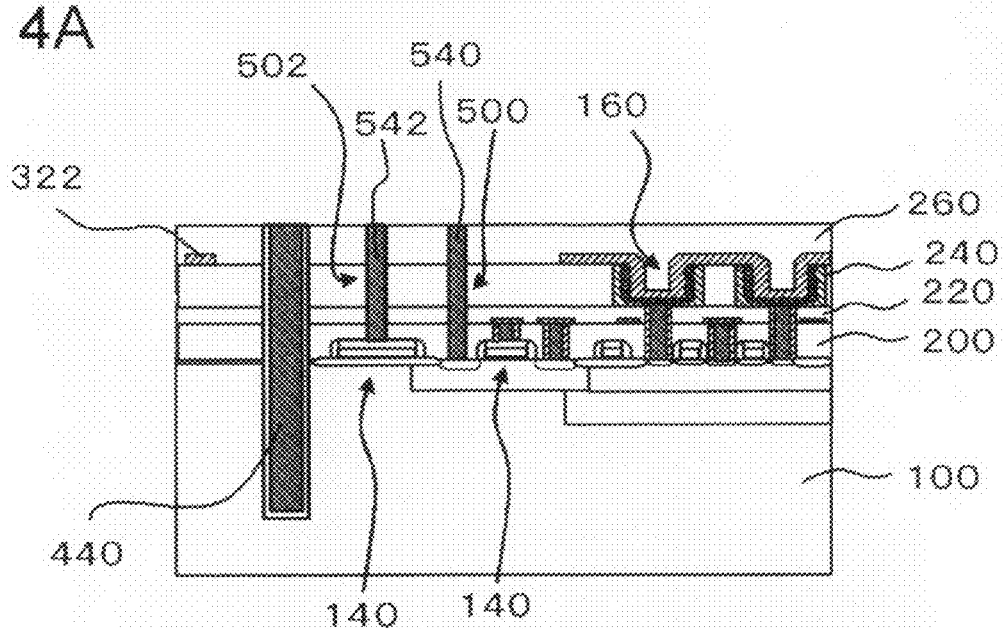

The resist pattern 52 is then removed as illustrated in FIG. 4A. Next, a barrier film (not illustrated) is formed over the side faces and bottom of the second holes 500, 502, and the second holes 500, 502 are then filled with the connection plugs 540, 542. The connection plugs 540, 542 may be formed typically by carrying out a step of forming an electro-conductive film and the CMP (Chemical Mechanical Polishing) process in this order.

Figure 4B:
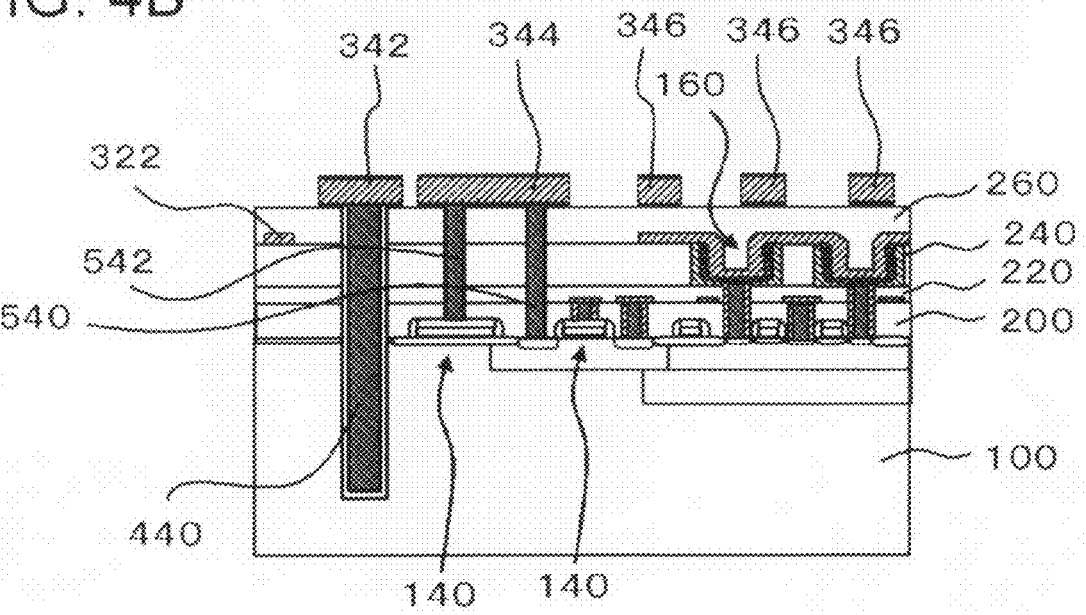

Next, as illustrated in FIG. 4B, interconnects 342, 344, 346 are formed on the surface of the insulating interlayer 260. The interconnect 342 is positioned on the through-electrode 440, and the interconnect 344 connects the connection plugs 540, 542 with each other. When the interconnects 342, 344, 346 are formed, alignment is carried out on the basis of the alignment mark 322.

Figure 5A:
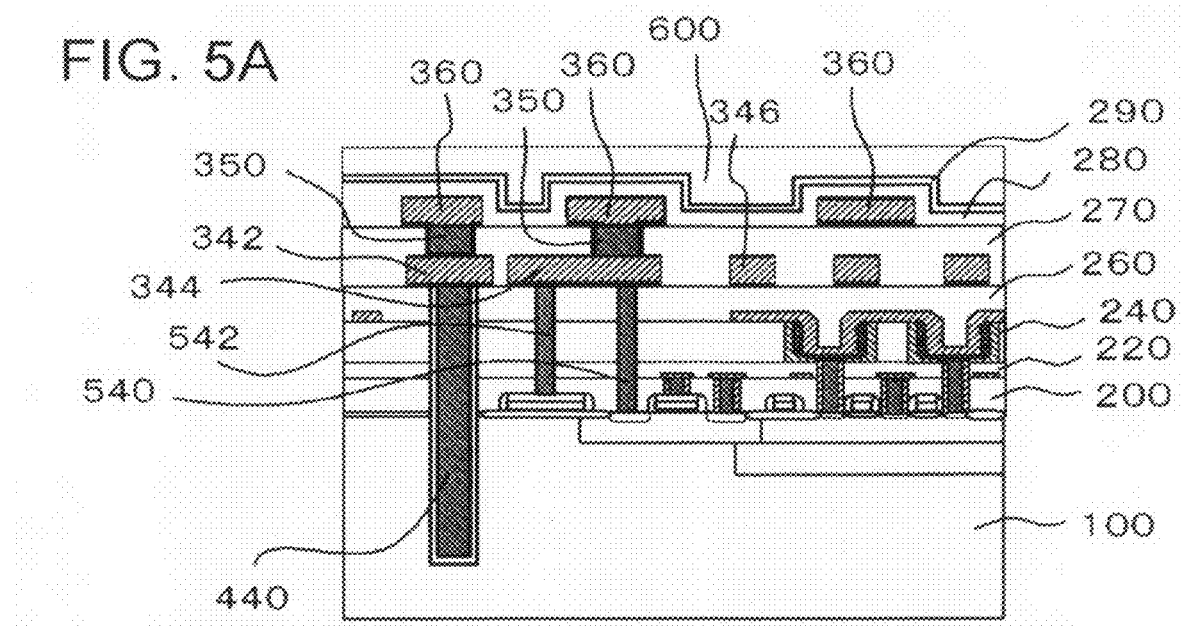

Thereafter, as illustrated in FIG. 5A, an insulating interlayer 270 is formed over the insulating interlayer 260 and over the interconnects 342, 344, 346, and connection plugs 350 and interconnects 360 are formed. The interconnects 360 are positioned on the surface of the insulating interlayer 270, and the connection plugs 350 which connect the interconnects 360 and the interconnects 342, 344, while being filled in the insulating interlayer 270. Next, protective films 280, 290 are formed in this order over the insulating interlayer 270 and the interconnects 360, and a resin layer 600 and bumps (not illustrated) are further formed over the protective film 290. The bumps are electrically connected to any interconnects 360.

Figure 5B:
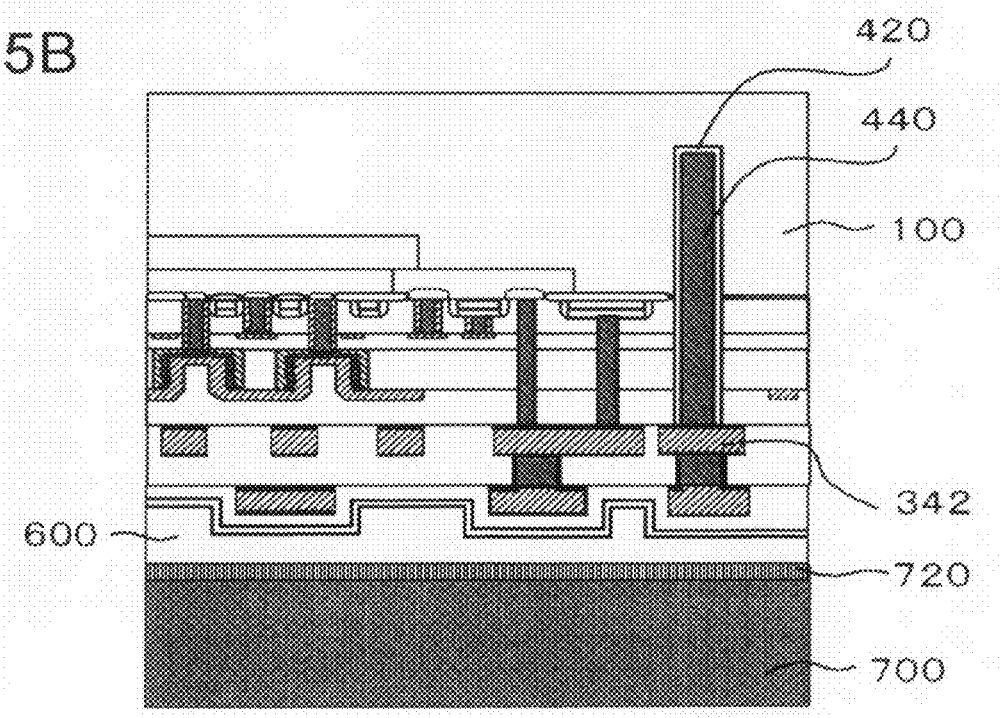

Next, as illustrated in FIG. 5B, a pressure-sensitive adhesive layer 720 is formed on the top surface of the resin layer 600, and the resin layer 600 is bonded to the support 700 while placing the pressure-sensitive adhesive layer 720 in between. The pressure-sensitive adhesive layer 720 is typically an adhesive tape. The adhesive tape is composed of a base, and pressure-sensitive adhesive layers formed on both surfaces thereof. The base composing the adhesive tape may typically be composed of polyolefin-base resin, polyester-base resin or the like. The pressure-sensitive adhesive composing the adhesive tape may typically be composed of acryl-base, emulsion-type, pressure-sensitive adhesive; acryl-base, solution-type, pressure-sensitive adhesive; urethane-base, pressure-sensitive adhesive, or the like.

As a material for composing the support 700, those durable against heat, chemicals, external force and so forth, possibly applied typically in the process of thinning of the substrate 100 by means of grinding and etching of the back surface described later, may be adoptable. Quartz and glasses such as Pyrex (registered trademark) may be adoptable. Also materials other than glass, such as acrylic resin or other plastics, may be adoptable.

Figure 6A:
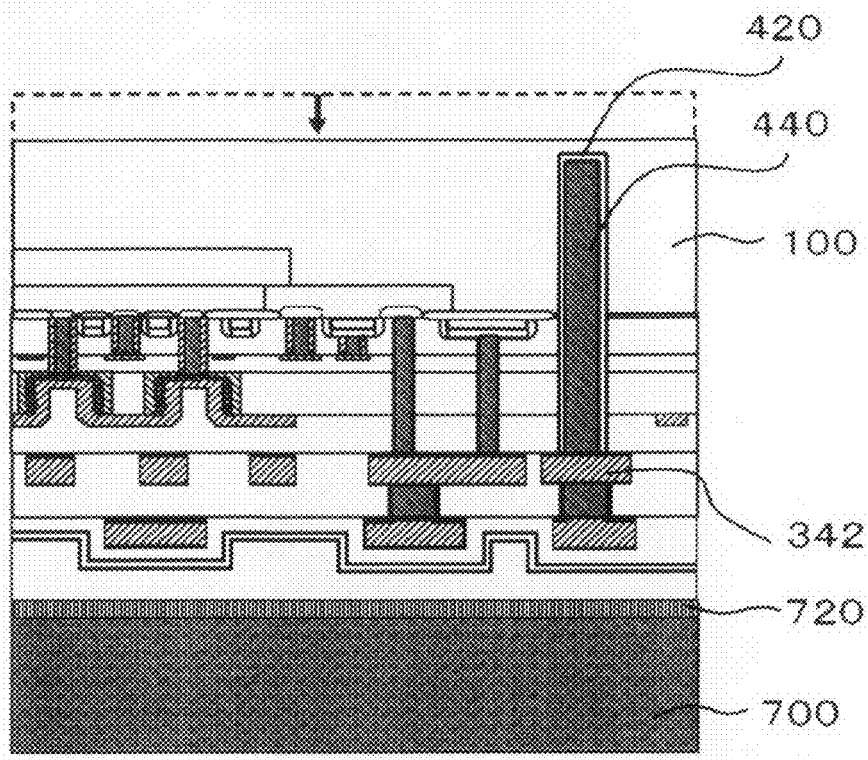

Next, as illustrated in, FIG. 6A, the back surface of the substrate 100 is ground. In this process, grinding is carried out so as not to expose the inner wall insulating film 420 and through-electrode 440 out onto the back surface of the substrate 100. The thickness of the portion between the back surface of the substrate 100 after being ground to the inner wall insulating film 420 may be 0.1 μm or larger and 1 μm or smaller, for example.

Figure 6B:
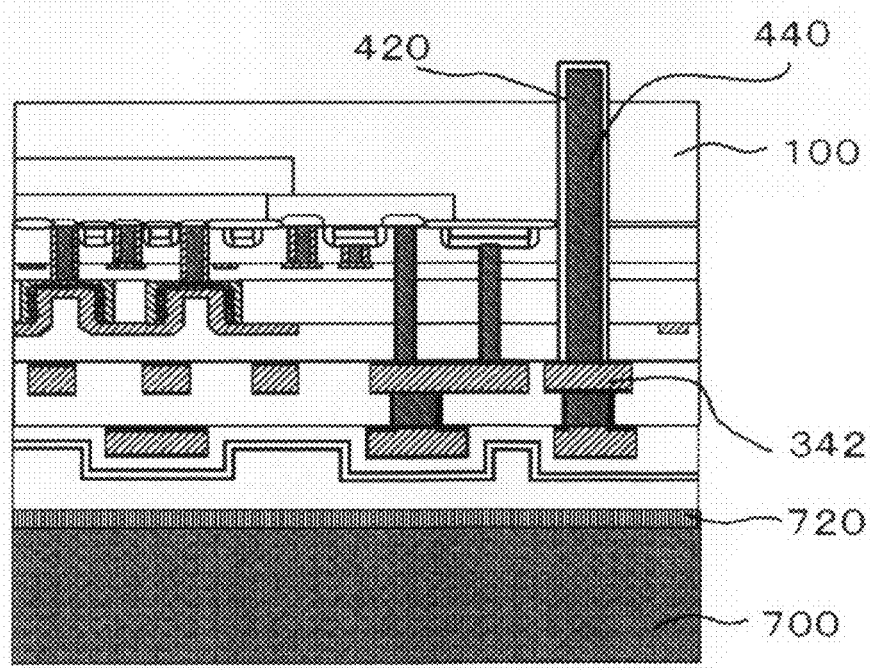

Next, as illustrated in FIG. 6B, the back surface of the substrate 100 is etched. By the etching, the inner wall insulating film 420 and the through-electrode 440 are projected out from the back surface of the substrate 100, to as high as approximately 1 μm or higher and 5 μm or lower, for example.

Figure 7A:
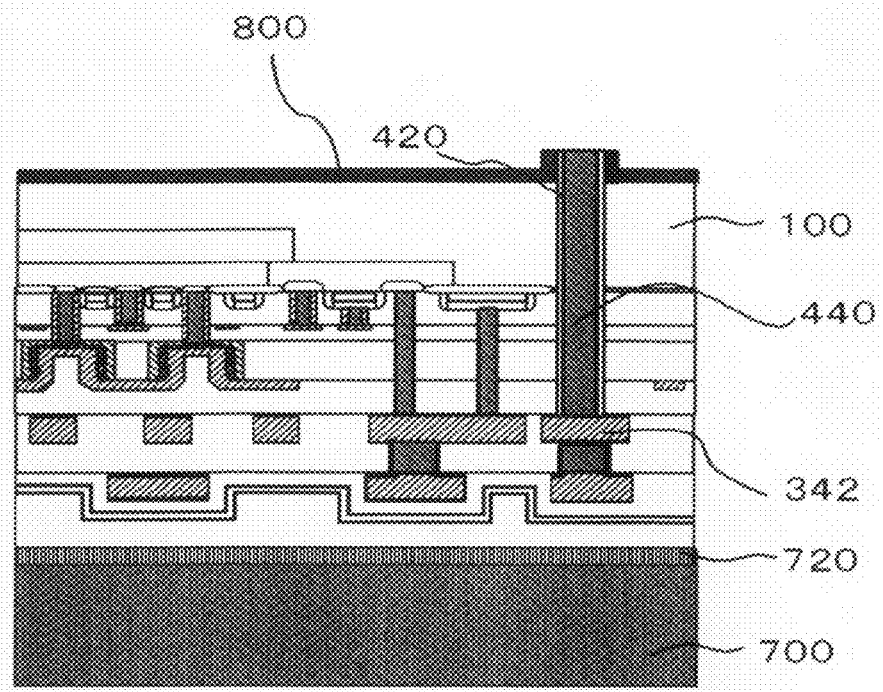

Next, as illustrated in FIG. 7A, the insulating film 800 is formed over the back surface of the substrate 100 and the inner wall insulating film 420. The insulating film 800 is typically a SiN film, and is formed typically by CVD. Next, portions of the inner wall insulating film 420 and the insulating film 800 positioned on the end face of the through-electrode 440 are removed typically by CMP, to thereby expose the end face of the through-electrode 440.

Figure 7B:
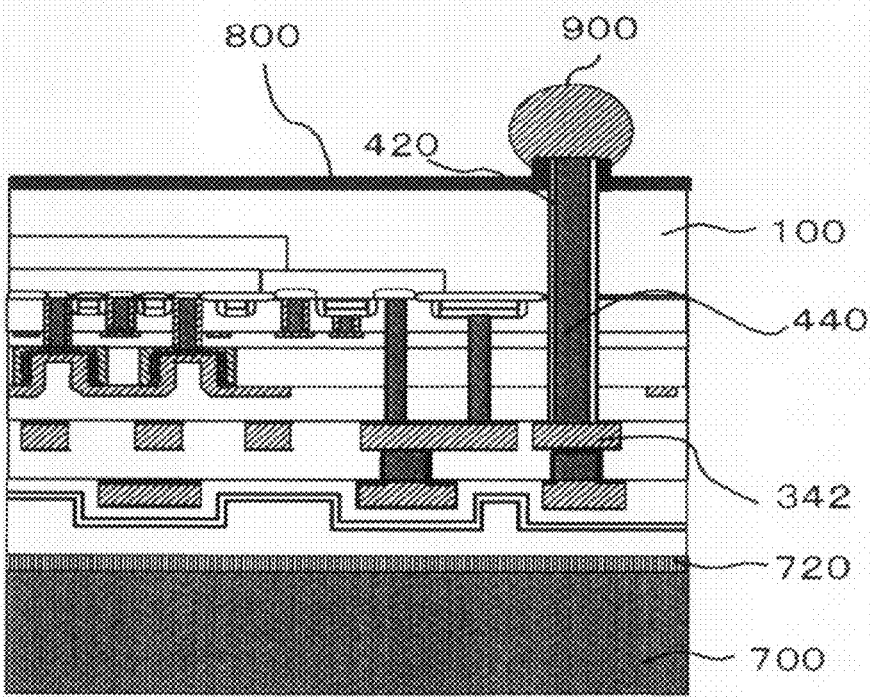

Next, as illustrated in FIG. 7B, the bump 900 is formed on the back surface side of the substrate 100. Thereafter, the pressure-sensitive adhesive layer 720 and the support 700 are removed.

Effects expectable from this embodiment will be explained below. First, as has been described in the above, one end of the through-electrode 440 is directly connected to the interconnect 342, so that the connection failure between the through-electrode 440 and the interconnect 342 may be suppressed. In particular in this embodiment, the interconnect 342 is positioned above the capacitor elements 160. The width of interconnect positioned in the upper layer of the capacitor element may generally be larger than that of the interconnect positioned in the lower layer of the capacitor elements. Accordingly, allowance for misalignment in the relative position between the through-electrode 440 and the interconnect 342 may be increased, so that the connection failure between the through-electrode 440 and the interconnect 342 may further reliably be suppressed.

Moreover, the insulating interlayer 260 is provided as an insulating interlayer in the third layer, while placing the insulating interlayer 200 in the first layer and the insulating interlayers 220, 240 in the second layer, between the substrate 100 and the insulating interlayer 260. The through-electrode 440 is directly connected to the interconnect 342, while being formed so as to extend through the substrate 100 and the insulating interlayers 200, 220, 240, 260. Accordingly, the contact resistance between the through-electrode 440 and the interconnect 342 may be reduced, and pattern layout of the interconnects in the process of designing the semiconductor device may be simplified, as compared with the case where the through-electrode 440 is connected to the interconnect 342 through electro-conductive components respectively buried in the insulating interlayers 200, 220, 240, 260. This effect may be obtained from both cases where the electro-conductive component forms a part of interconnects respectively buried in the insulating interlayers 200, 220, 240, 260, and where the electro-conductive component forms an electro-conductive plug. This effect may be obtained also from the case where the insulating interlayer 260 forms an insulating interlayer in the second layer, unlike the exemplary case illustrated in this drawing.

For the case where the interconnect layers are connected via the connection plugs as shown in this embodiment, the through-electrode 440 and the interconnect 342 may necessarily be connected via connection plugs, unless otherwise the through-electrode 440 is formed so as to extend through the insulating interlayers 200, 220, 240, 260. In this case, the connection resistance will inevitably increase irrespective of at which hierarchy of layer the insulating interlayer 260 is positioned, as compared with the example illustrated in this drawing. As a consequence, for the case where the interconnect layers are connected via the connection plugs, the direct connection between the through-electrode 440 and the interconnect 342 as shown in this embodiment may successfully reduce the contact resistance between the through-electrode 440 and the interconnect 342. This effect may be obtained also for the case where the insulating interlayer 260 composes an insulating interlayer in the first layer, unlike the exemplary case illustrated in the drawings.

The diameter of the through-electrode 440 is larger than the diameter of the connection plugs 540, 542. Accordingly, the resistance between the bump 900 and the interconnect 342 may still further be reduced, as compared with the case where the interconnect layers are connected via the connection plugs.

Since the diameter of the through-electrode 440 is larger than the diameter of the connection plugs 540, 542, so that the thickness of an electro-conductive film composing the through-electrode 440 is larger than that of the an electro-conductive film composing the connection plugs 540, 542. The etch-back process and the CMP process for forming the through-electrode 440 will consequently take a longer time than the etch-back process and the CMP process for forming the connection plugs 540, 542. For this reason, formation of the connection plugs 540, 542 prior to formation of the through-electrode 440 may damage the surfaces of the connection plugs 540, 542. In contrast, the surfaces of the connection plugs 540, 542 may be prevented from being damaged in this embodiment, because the connection plugs 540, 542 are formed after the through-electrode 440 is formed.

The other end of the through-electrode 440 is projected out from the back surface of the substrate 100. The bump 900 is therefore kept away from the back surface of the substrate 100. In an stacked structure having one semiconductor device bonded to another semiconductor device, this configuration ensures a space between these semiconductor devices. The configuration also suppresses short-circuiting between the bump 900 and the substrate 100.

Around the through-electrode 440 on the back surface of the substrate 100, there is formed the insulating film 800. This configuration further reliably suppresses the short-circuiting between the bump 900 and the substrate 100.

Since the interconnect 342 is formed after the through-electrode 440 is formed, the interconnect 342 may be prevented from being damaged, unlike the case where the first hole 400 is formed and filled with the through-electrode 440 from the back surface side of the substrate 100.

Alignment of the first hole 400 to be filled with the through-electrode 440, and alignment of the interconnect 342 are respectively carried out on the basis of the alignment mark 322. Both alignment processes are carried out by detecting the alignment mark 322 through the insulating interlayer 260. On the other hand, any attempts of forming the hole to be filled with the through-electrode from the back surface side of the substrate 100, the alignment of the hole may necessarily be carried out by detecting the alignment mark 322 from the back surface side of the substrate 100, or on the basis of any other alignment mark. These attempts may result in degraded accuracy in alignment, as compared with this embodiment. According to this embodiment, the through-electrode 440 and the interconnect 342 may therefore be suppressed from being misaligned, as compared with the case where the through-electrode is filled from the back surface side of the substrate 100. As a consequence, it is no more necessary to thicken the interconnect 342 or the through-electrode 440, for the purpose of suppressing misalignment between the through-electrode 440 and the interconnect 342.

In the process of exposing the through-electrode 440 out from the back surface of the substrate 100, the back surface of the substrate 100 is initially ground only to a degree the through-electrode 440 is not exposed, and the through-electrode 440 is then exposed by etching. By virtue of this process, the end portion of the through-electrode 440 may be prevented from being elongated, and the through-electrode 440 is prevented from re-adhesion of debris of grinding, as compared with the case where the through-electrode 440 is exposed only by grinding of the back surface of the substrate 100.

The embodiments of the present invention, having been described referring to the attached drawings, are merely for exemplary purposes, allowing adoption of any other various configurations. For example, the through-electrode 440 may be formed after the connection plugs 540, 542 are formed.

It is apparent that the present invention is not limited to the above embodiment, that may be modified and changed without departing from the scope and spirit of the invention.

What is claimed is:

1. A semiconductor device comprising:
a substrate;
a first insulating interlayer formed on one surface of said substrate;
a second insulating interlayer positioned between said first insulating interlayer and said substrate;
an electro-conductive pattern formed on said first insulating interlayer;
a connection terminal provided on an other surface of said substrate;
a through-electrode extended through said substrate, said first insulating interlayer, and said second insulating layer, so as to connect said electro-conductive pattern and said connection terminal;
an element positioned below said first insulating interlayer; and
a connection plug extended through said first insulating interlayer and electrically connected to said element,
wherein the diameter of said through-electrode is five times or more as large as the diameter of said connection plug.

2. The semiconductor device as claimed in claim 1, wherein said through-electrode is projected out from the other surface of said substrate.

3. The semiconductor device as claimed in claim 2, further comprising:
an insulating film formed around the circumference of said through-electrode on the other surface of said substrate.

4. The semiconductor device as claimed in claim 1, further comprising a capacitor element positioned below said first insulating film.

5. The semiconductor device as claimed in claim 1, wherein the through-electrode directly contacts the electro-conductive pattern.

6. The semiconductor device as claimed in claim 1, further comprising at least one capacitor element formed below the electro-conductive pattern,
wherein a width of the electro-conductive pattern is larger than that of an interconnect in a lower layer of the capacitor element.

7. The semiconductor device as claimed in claim 2, wherein the connection terminal is spaced from the other surface of said substrate by the through-electrode.

8. The semiconductor device as claimed in claim 2, further comprising an insulating film formed along the other surface of said substrate and around a portion of the through-electrode projected out from the other surface.

9. The semiconductor device according to claim 1, further comprising an insulating layer formed on a side wall of a through hole filled by said through-electrode, wherein said insulating layer is formed from said substrate to said first insulating interlayer.

10. A semiconductor device, comprising:

a substrate;

a first insulating interlayer formed on one surface of said substrate;

a second insulating layer interlayer formed between said first insulating interlayer and said substrate;

a capacitor element positioned on said second insulating interlayer;

a contact buried in said second insulating interlayer, said contact being connected to said capacitor;

an electro-conductive pattern formed on said first insulating interlayer;

a connection terminal provided on another surface of said substrate; and a through-electrode extended through said substrate and said first insulating interlayer, so as to connect said electro-conductive pattern and said connection terminal.

* * * * *